(12) United States Patent
Luh

(10) Patent No.: US 7,236,017 B2
(45) Date of Patent: Jun. 26, 2007

(54) HIGH SPEED SAMPLE-AND-HOLD CIRCUIT

(75) Inventor: Louis Luh, San Gabriel, CA (US)

(73) Assignee: The Boeing Company, Chicago, IL (US)

( * ) Notice: Subject to any disclaimer, the term of this patent is extended or adjusted under 35 U.S.C. 154(b) by 145 days.

(21) Appl. No.: 11/029,605

(22) Filed: Jan. 5, 2005

(65) Prior Publication Data

US 2006/0145729 A1    Jul. 6, 2006

(51) Int. Cl.
    *G11C 27/02* (2006.01)
(52) U.S. Cl. .......................................... 327/94; 327/95
(58) Field of Classification Search ............ 327/94–95, 327/362, 538, 540
    See application file for complete search history.

(56) References Cited

U.S. PATENT DOCUMENTS

| | | | | |
|---|---|---|---|---|
| 5,313,113 | A | * | 5/1994 | Linder .......................... 327/92 |
| 5,343,163 | A | * | 8/1994 | Linder et al. ................ 330/252 |
| 6,285,220 | B1 | * | 9/2001 | Gaillard et al. ................ 327/94 |
| 6,597,299 | B1 | * | 7/2003 | Bugeja ........................ 341/122 |

* cited by examiner

*Primary Examiner*—Dinh T. Le
(74) *Attorney, Agent, or Firm*—Norman E. Carte; MacPherson Kwok Chen & Heid LLP

(57) ABSTRACT

The use of a dynamic current bias technique to dynamically bias a voltage switch of a sample-and-hold circuit is disclosed. Dynamically biasing the voltage switch mitigates nonlinear distortion caused by $V_{BE}$ ($V_{GS}$) variation during charging and discharging the holding capacitor of the sample-and-hold circuit The bandwidth of the sample-and-hold circuit is enhanced.

18 Claims, 3 Drawing Sheets

US 7,236,017 B2

HIGH SPEED SAMPLE-AND-HOLD CIRCUIT

TECHNICAL FIELD

The present invention relates generally to electrical circuits and, more particularly, to a high speed sample-and-hold circuit having dynamic current bias.

BACKGROUND

Sample-and-hold circuits are commonly used in the front end of analog-to-digital converters (ADCs). A sample-and-hold circuit holds a sample of the continuously changing analog signal for a period of time so that the following ADC circuit can convert the signal to a digital signal representative thereof. For direct-sampling wireless communication systems, sample-and-hold circuits are especially important. They hold samples of the rapidly changing radio frequency (RF) signal for a sufficient time for the relatively slower ADC to process and convert the samples into digital signals representative thereof. As those skilled in the art will appreciate, such digital signals offer some advantages in the processing thereof. In many instances, it is necessary to convert RF signals into digital form because of the inherently more flexible, versatile, and programmable nature of digital signal processing.

Typically, the direct-sampling analog-to-digital conversion of RF signals requires the use of wide bandwidth sample-and-hold circuits, in order to track the rapidly changing RF input signal during the track (sample) mode.

Although contemporary analog-to-digital converters have proven generally suitable for applications such as the direct conversion of RF communication signals to digital signals, such contemporary analog-to-digital converters suffer from power and linearity trade-offs, as well as bandwidth limitations due to their limited tracking ability for multi-GHz signals.

As a result, there is a need for a wide bandwidth analog-to-digital converter having an improved sample-and-hold circuit wherein the linearity and resolution are sufficient to facilitate the construction of communication systems having reduced complexity, reduced cost, enhanced receiver sensitivity, and improved signal quality.

SUMMARY

Systems and methods are disclosed herein to provide an improved sample-and-hold circuit suitable for such applications as use in analog-to-digital converters. According to one aspect of the present invention, higher resolution, less distortion, and less power consumption is provided when digitizing very high frequency signals. For example, in accordance with one aspect of the present invention, a dynamic current bias technique is used to dynamically bias a voltage switch of a sample-and-hold circuit. Dynamic biasing of the voltage switch mitigates nonlinear distortion caused by $V_{BE}$ ($V_{GS}$) variation when charging and discharging the voltage holding capacitor of the sample-and-hold circuit. The bandwidth of the sample-and-hold circuit is also desirably enhanced.

More specifically, in accordance with one embodiment of the present invention, an emitter/source follower voltage switch that is used for sampling in a sample-and-hold circuit is dynamically biased via a bias current that varies according to the charge and discharge current of a holding capacitor, so that $V_{BE}/V_{GS}$ of the voltage switch is held approximately constant during the track mode of the sample-and-hold circuit.

Holding $V_{BE}/V_{GS}$ approximately constant during the track mode mitigates undesirable nonlinear distortion caused by $V_{BE}/V_{GS}$ variation when charging and discharging the voltage holding capacitor. The dynamically varied bias current provides the charging and discharging currents for the voltage holding capacitor. Therefore, the sample-and-hold circuit is capable of responding to substantially higher frequency input signals as compared to contemporary sample-and-hold circuits. Accordingly, the sample-and-hold circuit has enhanced bandwidth with respect to contemporary sample-and-hold circuits.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

Figure 1:
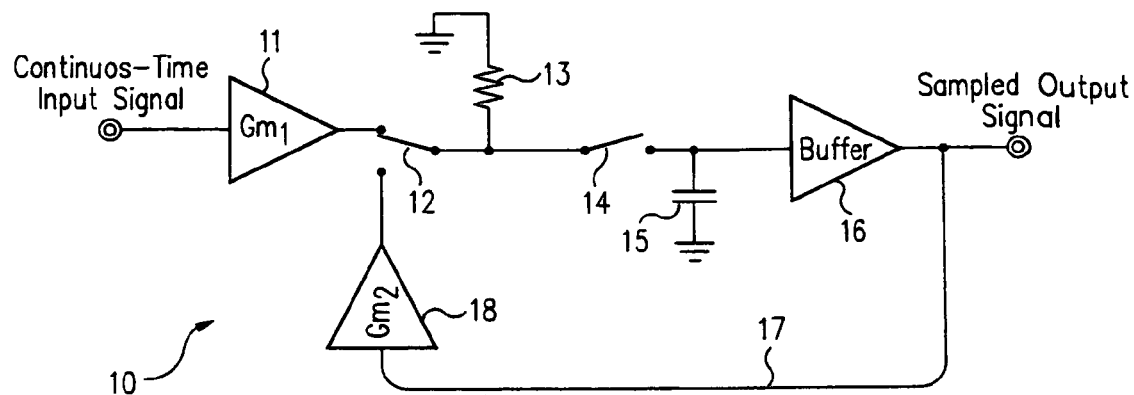
FIG. 1 shows a schematic diagram illustrating a contemporary sample-and-hold circuit.

FIG. 1 shows a contemporary sample-and-hold circuit 10. This circuit is commonly used in high-speed, wide-bandwidth, radio frequency (RF) communications. This is an open-loop sample-and-hold circuit having hold signal feedback to isolate the input signal from feedthrough.

According to this contemporary sample-and-hold circuit 10, a voltage input signal is converted into a corresponding current signal by a transconductance cell 11. When the sample-and-hold circuit is in a track mode, the current signal is connected through a current switch 12 and then converted back into a voltage by a resistor 13. This voltage is sampled by a sampling or voltage switch 14 and is acquired or held by a voltage holding capacitor 15. The held voltage signal is buffered by a unity-gain amplifier buffer 16, the output of which defines a sampled output signal, and is then used by an analog-to-digital converter.

After a sample has been acquired, sample-and-hold circuit 10 changes from the track mode, wherein switch 12 connects to transconductance cell 11, to a hold mode, wherein switch 12 connects to transconductance cell 18. In the track mode, the voltage on capacitor 15 tracks the input signal provided to transconductance cell 11. In the hold mode, the voltage on capacitor 15 remains substantially stable (at a substantially constant voltage), so as to be suitable for analog-to-digital conversion. Transconductance cell 18 converts the sampled output signal from buffer 16 into current and the current is then converted back into a voltage by resistor 13.

Thus, after a sample has been acquired, switch 12 moves from a position connecting the output of transconductance cell 11 to resistor 13 to a position connecting the output of transconductance cell 18 to resistor 13. During the hold mode, the output current of transconductance cell 18 determines the voltage across resistor 13. The voltage across resistor 13 is held substantially steady.

A voltage switch 14 is used to track and hold the input signal in a sample-and-hold circuit for high speed operation. It is desirable that voltage switch 14 operate rapidly, so as to quickly charge and discharge voltage holding capacitor 15 during the track mode. Thus, voltage switch 14 needs to have very good driving capacity. Slow operation of voltage switch 14 is a substantial source of undesirable distortion in contemporary sample-and-hold circuits.

Figure 2:
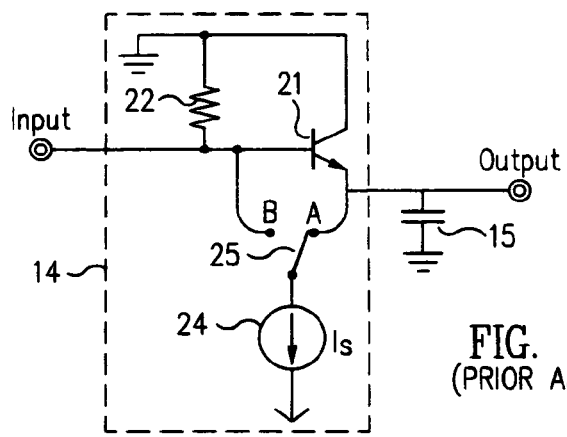
FIG. 2 shows a schematic diagram illustrating a simplified implementation of a voltage switch that is commonly used in the sample-and-hold circuit of FIG. 1, according to the contemporary practice.

FIG. 2 shows a simplified implementation of the contemporary voltage switch 14 of the sample-and-hold circuit 10 of FIG. 1. A switching transistor 21, in this instance a bipolar junction transistor (BJT), is controlled by a resistor 22 and its input current. When switch 25 is set to node A, switching transistor 21 functions as a normal emitter follower. This causes the output of voltage switch 14 to track the input signal.

When switch 25 is set to node B, the emitter of transistor 21 is floating and the base thereof is pulled down by a current sink 24. Thus, when switch 25 is set to node B, the output of voltage switch 14 is isolated from the input thereof and the voltage on voltage holding capacitor 15 (FIG. 1) is held.

Distortion for the contemporary voltage switch 14 of FIG. 2 is caused by a slew rate limitation as well as by undesirable $V_{BE}$ variation for switching transistor 21. The slew rate is limited by the size of voltage holding capacitor 15 and the bias current of current sink 24. In order to minimize distortion, the capacitance of voltage holding capacitor 15 needs to be very small and/or the bias current needs to be very large. However, neither of these solutions is desirable.

The use of a very small capacitance for voltage holding capacitor 15 causes high KT/C switching noise, faster drop rate (capacitor leaks charges), and makes design of output buffer 16 (FIG. 1) difficult. In this instance, buffer 16 has to accommodate very small input currents, which inherently makes buffer 16 unacceptably slow and eventually a settling issue which causes the buffer to be very slow and eventually a settling issue for the $Gm_2$ signal path.

The use of a high bias current undesirably introduces noise. It also increases power consumption. Thus, neither decreasing the capacitance of voltage holding capacitor 15 nor increasing the bias current of current sink 24 provides a desirable way to increase the slew rate.

The $V_{BE}$ variation that contributes to distortion is caused by rapid changes in the charge and discharge current for voltage holding capacitor 15. Since the diode-like transistor is a non-linear device, $V_{BE}$ variation causes distortion of the output of sample-and-hold circuit 10. One way to mitigate the problem of $V_{BE}$ variation is to increase the bias current. But, as we have seen, this results in undesirable increases in noise and power consumption.

In accordance with one aspect of the present invention, a dynamic current bias technique is used to dynamically bias a voltage switch of a sample-and-hold circuit. Dynamically biasing the voltage switch mitigates nonlinear distortion caused by $V_{BE}$ ($V_{GS}$) variation for charging and discharging the holding capacitor of the sample-and-hold circuit.

Holding $V_{BE}/V_{GS}$ approximately constant during the track mode mitigates undesirable nonlinear distortion caused by $V_{BE}/V_{GS}$ variation during charging and discharging of the voltage holding capacitor. The dynamically varied bias current better facilitates rapid charging and discharging currents for the holding capacitor.

Figure 3:
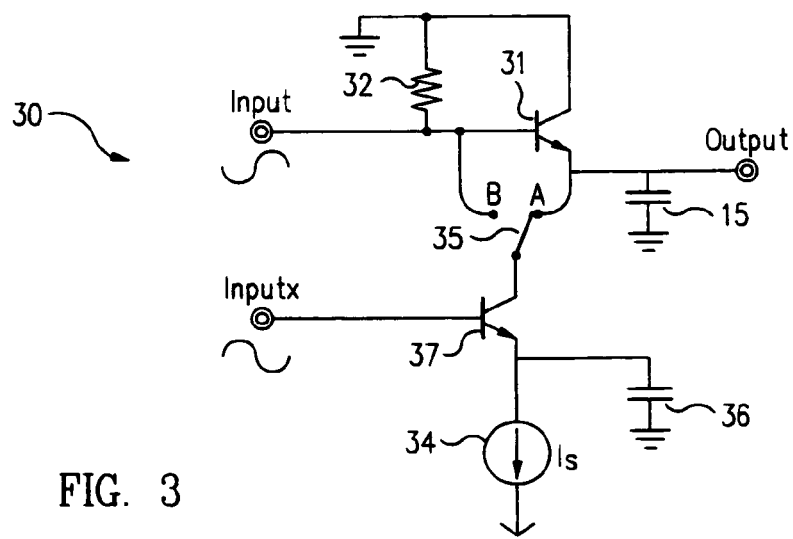
FIG. 3 shows a schematic diagram illustrating a circuit for generating a dynamic bias current for a voltage switch that provides a constant $V_{BE}$ voltage so as to mitigate distortion, according to one embodiment of the present invention.

FIG. 3 shows a voltage switch 30 that is configured to utilize dynamic biasing of a switching transistor 31. A switch 35 switches a current sink 34 between nodes A and B, as described above.

According to this exemplary embodiment of the present invention, a dynamic biasing circuit comprises a biasing transistor 37 that is coupled to receive a complimentary input signal. That is, biasing transistor 37 receives a signal that is approximately 180° out of phase with respect to the signal applied to switching transistor 31.

The biasing circuit further comprises an augmenting capacitor 36 that is used to generate the charge and discharge current for the voltage holding capacitor 15. The charge and discharge current of augmenting capacitor 36 passes through biasing transistor 37 and is used to provide current for the charging and discharging of voltage holding capacitor 15. Thus, biasing transistor 37 generates and delivers current from augmenting capacitor 36 to voltage holding capacitor 15.

If biasing transistor 37 has a sufficiently high β, and voltage holding capacitor 15 and augmenting capacitor 36 are well matched, then biasing transistor 37 will accommodate variations in charge and discharge currents. That is, biasing transistor 37 will readily facilitate the charging and discharging of voltage holding capacitor 15 with current flow therethrough to and from augmenting capacitor 36. Further, switching transistor 31 will have a substantially constant bias current during the track mode and will thus have a substantially constant $V_{BE}$, and consequently distortion will be reduced.

However, according to this exemplary embodiment of the present invention, current variation is still limited by the bias current of a current sink 34. Thus, the output of voltage switch 30 may undesirably suffer from harmonic distortion if the input signal changes too rapidly.

Figure 4:
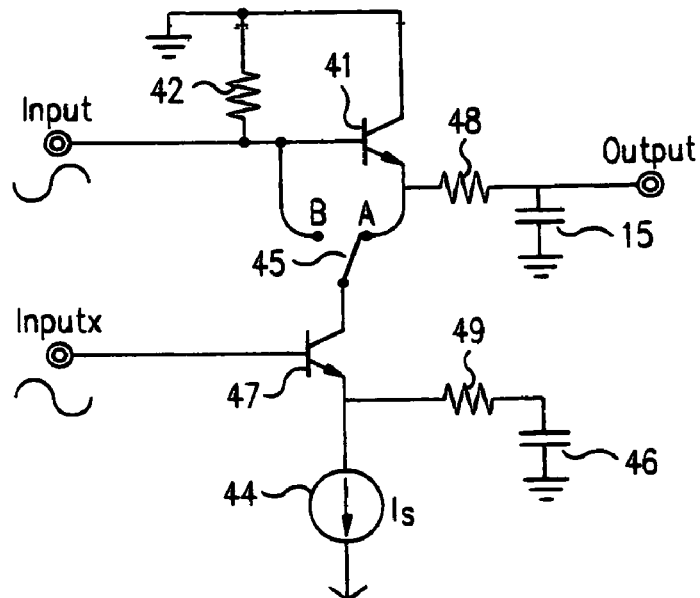
FIG. 4 shows a schematic illustrating another exemplary circuit for generating a dynamic bias circuit having additional resistors to limit charge and discharge currents to the capacitors in order to further mitigate distortion, according to one embodiment of the present invention.

FIG. 4 shows a modification of the voltage switch 30 of FIG. 3, wherein such harmonic distortion is mitigated. A switch 45 again switches a current sink 44 between nodes A and B, as described above.

Voltage switch 40 of FIG. 4 has a voltage holding capacitor path resistor 48 and an augmenting capacitor path resistor 49 added, so as to limit the rate at which input signal changes are applied to voltage holding capacitor 15.

As discussed above, a biasing transistor 47 not only provides substantially constant bias current to switching transistor 41, but it also provides charging and discharging current for voltage holding capacitor 15. This dynamically varied charging and discharging current also increases the slew rate of voltage switch 40.

Indeed, the voltage switch of the present invention may be configured such that biasing transistor 47 provides substantially all of the charging and discharging current for voltage holding capacitor 15 (and such that switching transistor 41 does not provide substantially any of the charging and discharging current for voltage holding capacitor 15).

Voltage switch 40 of the present invention is capable of charging and discharging voltage holding capacitor 15 substantially faster than contemporary voltage switches. Thus, the voltage switch of the present invention enhances the input signal bandwidth of a sample-and-hold circuit within which it is used.

Figure 5:
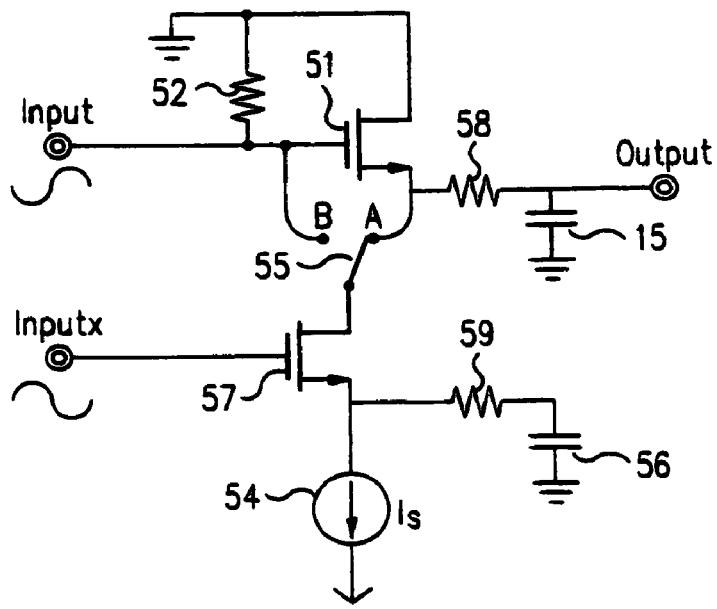
FIG. 5 shows a schematic diagram illustrating an exemplary CMOS implementation, according to one embodiment of the present invention.

FIG. 5 shows the implementation of an exemplary voltage switch formed according to the present invention wherein metal oxide (MOS) transistors are used instead of bipolar junction transistors (BJT). Thus, FIG. 5 shows the implementation of a source follower in an MOS sample-and-hold circuit.

In this exemplary embodiment of the present invention, bias resistor 52, switching transistor 51, biasing transistor 57, switch 55, current sink 54, current limiting resistor 58, current limiting resistor 59, voltage holding capacitor 15 and voltage augmenting capacitor 59 all function similarly to the analogous components of FIG. 4.

Figure 6:
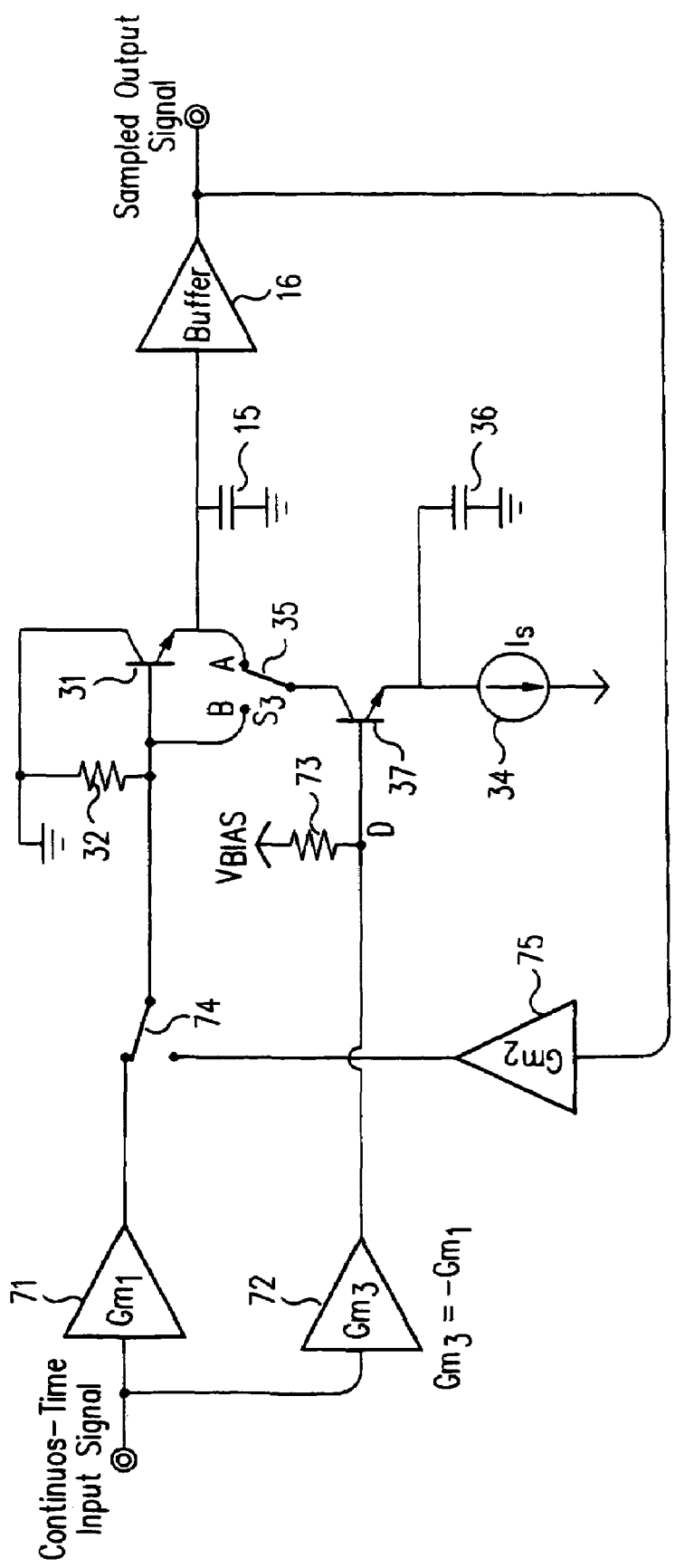
FIG. 6 shows a schematic diagram better illustrating the input for a dynamic bias circuit (such as that of FIG. 3), according to one aspect of the present invention.

As shown in FIG. 6, an exemplary implementation for generating the complementary input to drive transistor 37 of FIG. 3 is shown. Similar implementations can be used for the circuits of FIGS. 4 and 5. The analog input of the same sample-and-hold circuit is fed to transimpedance amplifier 71 ($Gm_1$) as well as transimpedance amplifier 72 ($Gm_3$). Transimpedance amplifier 71 and transimpedance amplifier 72 have approximately the same transconductance gains, but different signs (one is positive and one is negative). They are connected to substantially the same value of resistors, so that they generate the same, but complementary, voltage signals at node C and node D.

Although at least one aspect of the present invention discussed herein involves implementation of a voltage switch in a sample-and-hold circuit, those skilled in the art will appreciate that such aspect(s) of the present invention are likewise applicable to track and hold circuits and that the terms "sample-and-hold" and "track-and-hold" can be viewed herein as being generally synonymous.

The sample-and-hold circuit disclosed herein is capable of responding to substantially higher frequency input signals as compared to contemporary sample-and-hold circuits. That is, the sample-and-hold circuit, according to at least one aspect of the present invention, has enhanced bandwidth with respect to contemporary sample-and-hold circuits. The sample-and-hold circuit of the present invention thus enhances the performance of direct analog-to-digital converters, such as those for use in such RF applications as X and Ku band communication systems. The sample-and-hold circuit of the present invention enhances the linearity and resolution of wide bandwidth analog-to-digital converters and thus reduces the complexity and cost of communication systems, while enhancing the sensitivity of receivers and improving signal quality.

Embodiments described above illustrate but do not limit the invention. It should also be understood that numerous modifications and variations are possible in accordance with the principles of the present invention. Accordingly, the scope of the invention is defined only by the following claims.

I claim:

1. A voltage switch comprising:
    a switching transistor that receives an input signal and provides the input signal to a voltage holding capacitor;
    a circuit in electrical communication with the switching transistor, the circuit comprising:
        a biasing transistor coupled so as to receive a signal that is substantially complimentary with respect to the input signal; and
        an augmenting capacitor coupled to the biasing transistor so as to generate charging and discharging current which is substantially the same as the charging and discharging current of the voltage holding capacitor through the biasing transistor to the voltage holding capacitor, so as to provide the charging and discharging current for the voltage holding capacitor.

2. The voltage switch of claim 1, wherein the circuit mitigates $V_{BB}$ variation by maintaining a substantially constant bias current for the switching transistor.

3. The voltage switch of claim 1, wherein the circuit is also configured to charge and discharge the voltage holding capacitor.

4. The voltage switch of claim 1, wherein the augmenting capacitor matched with respect to a voltage holding capacitor, so as to generate substantially the same charging and discharging current for the voltage holding capacitor by the augmenting capacitor.

5. The voltage switch of claim 1, further comprising a resistor through which an output of the switching transistor flows, the resistor limiting current flow from the switching transistor to a voltage holding capacitor, so as to mitigate harmonic distortion.

6. The voltage switch of claim 1, wherein the circuit further comprises a resistor through which an output of the biasing transistor flows, the resistor at least partially controlling the charging and discharging currents for the voltage holding capacitor.

7. The voltage switch of claim 1, wherein the switching transistor and the biasing transistor comprise bipolar junction transistors (BJTs).

8. The voltage switch of claim 1, wherein the switching transistor and the biasing transistor comprise metal oxide semiconductor (MOS) transistors.

9. A method of capturing and holding a signal, the method comprising:
    charging and discharging a voltage holding capacitor with an input signal trough a voltage switch; and
    using an augmenting capacitor to charge/discharge the voltage holding capacitor, wherein current from the augmenting capacitor flowing thought a biasing switch provides substantially the same charging and discharging current for the voltage holding capacitor as well as provides a substantially constant bias current to the voltage switch during a track mode thereof, the augmenting capacitor being charged/discharged by a signal that is substantially complimentary with respect to the input signal.

10. A method of capturing and holding an input signal for analog to digital conversion thereof, the method comprising:
    providing a voltage switch that is coupled so as to selectively apply a voltage representative of the input signal to a holding capacitor;
    using an augmenting capacitor to charge/discharge the holding capacitor; and
    wherein current from the augmenting capacitor flows thought a biasing switch to provide a substantially constant bias current to the voltage switch during a track mode thereof.

11. The method of capturing and holding an input signal as recited in claim 10, wherein the voltage switch comprises a bipolar junction transistor emitter follower switch circuit.

12. The method of capturing and holding an input signal as recited in claim 10, wherein the voltage switch comprises a metal oxide semiconductor field effect (MOSFET) transistor source follower switch circuit.

13. The method of capturing and holding an input signal as recited in claim 10, wherein the voltage switch comprises a bipolar switch and a bias current varies according to a charge/discharge current of the voltage holding capacitor such that VBE of the voltage switch is held approximately constant during a track mode thereof.

14. The method of capturing and holding an input signal as recited in claim 10, wherein the voltage switch comprises a metal oxide semiconductor field effect (MOSFET) transistor switch and a bias current varies according to a charge/discharge current of the holding capacitor such that $V_{GS}$ of the voltage switch is held approximately constant during a track mode thereof.

15. The method of capturing and holding an input signal as recited in claim 10, further comprising using an augmenting capacitor help charge/discharge the holding capacitor, the augmenting capacitor by a signal that is substantially complimentary with respect to the input signal.

16. A sample and hold circuit, comprising:
   a first transconductance cell configured to convert an input analog signal from voltage to current;
   a voltage switch coupled to an output of the first transconductance cell, the voltage switch comprising:
      a first transistor coupled to the output of the first transconductance cell;
      a first capacitor coupled to an output of the first transistor;
      a second transistor coupled to the output of the first transistor through a current switch and configured to receive a. compliment of the analog input signal of the sample-and-hold circuit;
      a second capacitor coupled to an output of the second transistor;
      a switch coupled to the first transistor and the second transistor;
      a current sink coupled to the output of the second transistor;
   a buffer coupled to the output of the voltage switch; and
   a second transconductance cell coupled to the output of the buffer and selectively connectable to the voltage switch.

17. The sample and hold circuit as recited in claim 16, further comprising a current switch for selectively coupling the voltage switch to either the first transconductance cell or the second transconductance cell.

18. A voltage switch for use in a sample and hold circuit, the voltage switch comprising:
   a first transistor coupled to an output of the first transconductance cell;
      a first capacitor coupled to an output of the first transistor;
      a second transistor coupled to the output of the first transistor through a current switch and configured to receive a compliment of the analog input signal of the sample-and-hold circuit;
      a second capacitor coupled to an output of the second transistor;
      a switch coupled to the first transistor and the second transistor; and
      a current sink coupled to the output of the second transistor.

* * * * *